United States Patent
Baumgartner et al.

(10) Patent No.: US 7,600,209 B2
(45) Date of Patent: Oct. 6, 2009

(54) GENERATING CONSTRAINT PRESERVING TESTCASES IN THE PRESENCE OF DEAD-END CONSTRAINTS

(75) Inventors: Jason R. Baumgartner, Austin, TX (US); Robert L. Kanzelman, Rochester, MN (US); Hari Mony, Austin, TX (US); Viresh Paruthi, Austin, TX (US)

(73) Assignee: International Business Machines Corporation, Armonk, NY (US)

(*) Notice: Subject to any disclaimer, the term of this patent is extended or adjusted under 35 U.S.C. 154(b) by 299 days.

(21) Appl. No.: 11/673,298

(22) Filed: Feb. 9, 2007

(65) Prior Publication Data

US 2008/0195992 A1 Aug. 14, 2008

(51) Int. Cl.
*G06F 17/50* (2006.01)
(52) U.S. Cl. .................. 716/14; 716/4; 716/5
(58) Field of Classification Search ............ 716/4, 716/5, 14
See application file for complete search history.

(56) References Cited

U.S. PATENT DOCUMENTS

2005/0198597 A1* 9/2005 Zhu et al. ............... 716/4

2006/0206842 A1 9/2006 Baumgartner et al.

OTHER PUBLICATIONS

Biere et al., "SAT and ATPG: Boolean engines for formal hardware verification", IEEE, 2002, 4 pages.
Yuan et al., "Modeling Design Constraints and Biasing in Simulation Using BDDs", IEEE/ACM International Conference on Computer Aided Design, 1999, 6 pages.

* cited by examiner

*Primary Examiner*—Vuthe Siek
*Assistant Examiner*—Magid Y Dimyan
(74) *Attorney, Agent, or Firm*—Stephen J. Walder, Jr.; Diana R. Gerhardt

(57) ABSTRACT

Mechanisms for generating constraint preserving testcases in the presence of dead-end constraints are provided. A balance between precision and computational expense in generating the testcases is achieved by establishing a sliding window of constraint solving for a selected number of K time-steps in the future from a current time-step. The testcases solve for the constraints for the next K time-steps at every state of a netlist instead of just trying to solve the constraint for the present time-step. K is determined by determining, for each input, either a minimum length path depth or maximum length depth path from the input to the constraint. The largest depth value for the inputs to the netlist is then utilized as the depth for the netlist. This depth then is used to define the width of the sliding window of constraint solving.

30 Claims, 6 Drawing Sheets

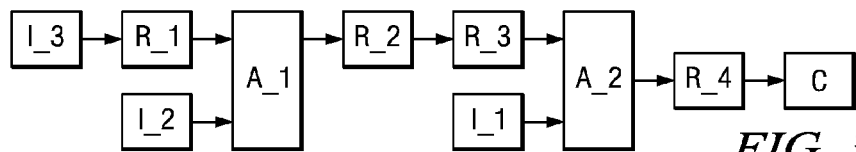
*FIG. 3A*
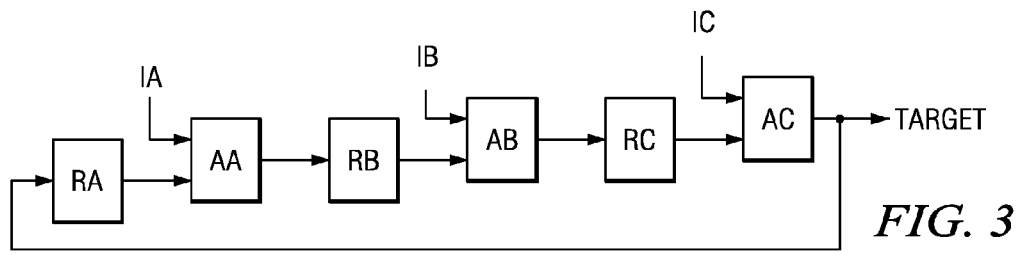
*FIG. 3B*
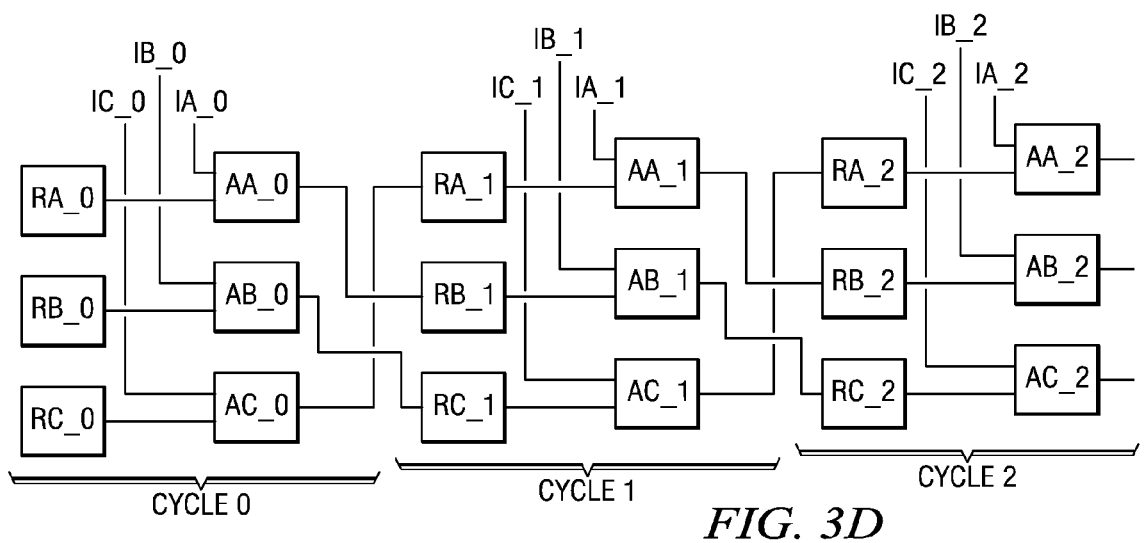
*FIG. 3C*
*FIG. 3D*

```
C(0) = init(R_4);
C(1) = init(R_3) AND I_1(0);
C(2) = init(R_2) AND I_1(1);
C(3) = init(R_1) AND I_2(0) AND I_1(2);
C(4) = I_3(0) AND I_2(1) AND I_1(3);
C(j) = I_3(j+1) AND I_2(j+2) AND I_1(j+4)
```
*FIG. 4A*
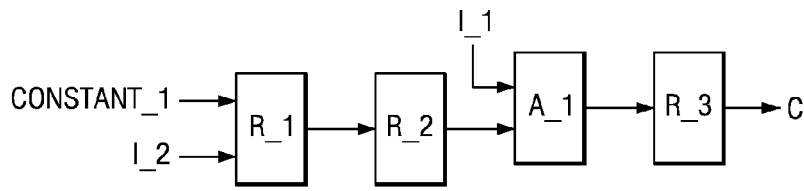
*FIG. 4B*
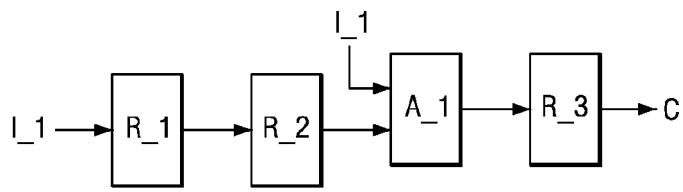
*FIG. 4C*
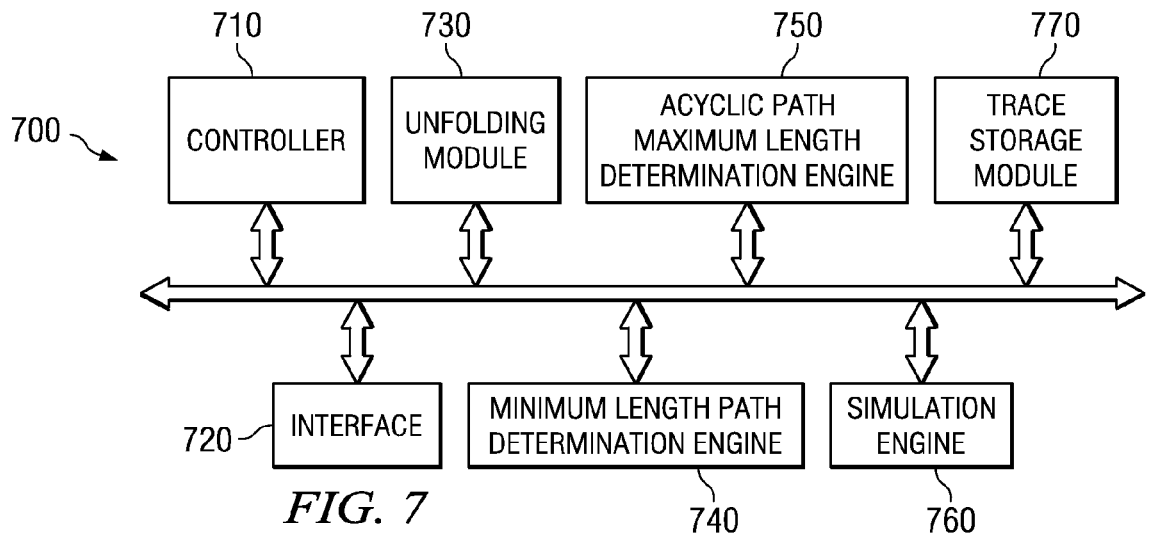
*FIG. 7*

```
Simulate_under_Dead_end_Constraints(Netlist N, unsigned Length){

K=();

Trace T = empty_trace();

for each constraint C in N

K(c) = get_sliding_window_unfold_depth(N,C);

compute_initial_state(N, T, K);

** this call evaluates the initial state definitions of registers in N,
      ** doing a K(C) step constraint satisfaction for each constraint to
      ** ensure that chosen values to inputs will not violate dead-end
      ** constraints in the future. It records its selected input
      ** valuations in T.

for(i=0; i<Length; i++)

simulate_and_satisfy_constraints(N, T, K, i);

** this call computes a legal set of inputs to apply to the netlist at
      ** time i by doing a K(C) step constraint satisfaction for each
      ** constraint to ensure that chosen values to inputs will not
      ** violate dead end constraints in the future. It does this by
      ** applying SAT algorithms to a K(C)-step unfolding of the
      ** constraints from the state in T at time i. It records its selected
      ** input valuations in T.

return T;
}
```

*FIG. 5*

```
get_sliding_window_unfold_depth(Netlist N, Constraint C){
  depth = 0;
  for each input i
    if (using_min_depth_heuristic)
      temp_depth = min_length_path(i, C);
    else
      temp_depth = max_length_acyclic_path(i,C);
    if((temp_depth != INFINITY) && (temp_depth>depth))
      depth = temp_depth;
  return depth;
}
```

*FIG. 6*

GENERATING CONSTRAINT PRESERVING TESTCASES IN THE PRESENCE OF DEAD-END CONSTRAINTS

BACKGROUND

1. Technical Field

The present application relates generally to an improved data processing system and method. More specifically, the present application is directed to a system and method for generating constraint preserving testcases in the presence of dead-end constraints.

2. Description of Related Art

A typical integrated circuit interacts with its design environment. During simulation-based functional verification, the design environment is modeled by a testbench. The modeling of design environments using constraints has gained widespread industrial application and most verification languages include constructs for specifying such constraints. Constraints confine simulations of a circuit design to a legal input space by specifying conditions that must hold in any state explored by a verification algorithm. Semantically, the verification tool must discard any states for which a constraint evaluates to a 0, i.e. the verification tool may never produce a failing scenario showing a violation of some property of the design.

Although constraints enable efficient modeling of design environments, they pose several challenges to verification algorithms. Constraint preserving testcase generation has been widely researched (see for example, the SimGen verification tool described in "Modeling Design Constraints and Biasing in Simulation Using BDDs," J. Yuan et al., ICCAD 1999). These solutions, however, do not address preservation of dead-end constraints which entail states for which there is no legal input stimulus. Such dead-end constraints cause simulation states that cause the verification tool to not be able to continue the verification process. Dead-end constraints tend to reduce the efficiency of explicit-state analysis as well as semi-formal analysis. When a dead-end state is reached, the only recourse is to backtrack to an earlier state.

Dead-end constraints are typically treated as user errors in known methodologies, such as in the SimGen verification tool. As such, it is left up to the user to fix the dead-end constraint problem such that there are no more dead-end states encountered. As a result, simulation pattern generation mechanisms for verification tools suffer from being highly ineffective under dead-end constraints.

SUMMARY

The illustrative embodiments provide a system and method for generating constraint preserving testcases in the presence of dead-end constraints. The illustrative embodiments generate constraint preserving testcases by balancing precision in not generating testcases that violate dead-end constraints with computational expense. This balance is achieved by establishing a sliding window of constraint solving for a selected number K time-steps in the future from a current time-step. The testcases solve for the constraints for the next K time-steps at every state of a netlist instead of just trying to solve the constraint for the present time-step.

The selected number of K time-steps is determined using unfolding analysis to analyze a function of the constraint over time. Essentially, for a particular netlist, each input is evaluated to determine either a minimum length path depth from the input to the constraint or, if the input affects the constraint at multiple time-steps, the maximum length path depth may be utilized. The largest depth value for the inputs to the netlist is then utilized as the depth for the netlist. This depth then is used to define the width of the sliding window of constraint solving.

The netlist may then be simulated using this sliding window of constraint solving. For each time step in the simulation, the K-step constraint satisfaction analysis is performed for each constraint of the netlist to ensure that chosen input values will not violate dead-end constraints in the future. This K-step constraint satisfaction analysis may involve a K-step unfolding of the constraints. The resulting input valuations may then be stored in a trace for later use in validating integrated circuit devices corresponding to the netlist.

In one illustrative embodiment, a method is provided for adjusting input values of testcases in the presence of dead-end constraints. The method may comprise analyzing a netlist, for a constraint of the netlist, to identify a time step parameter associated with the constraint for use in identifying dead-end constraint conditions. The method may further comprise simulating the netlist for a predetermined number of time steps and evaluating, at each time step, a state of elements of the netlist for a period of time steps in the future of the simulation, based on the time step parameter to determine if a value associated with the constraint of the netlist results in a dead-end constraint condition. The method may also comprise adjusting an input to the netlist if the value associated with the constraint of the netlist results in a dead-end constraint condition.

Moreover, the method may comprise recording the input to the netlist in a trace file if the value of the constraint of the netlist does not result in a dead-end constraint condition. The method may also comprise recording the adjusted input to the netlist in a trace file if the value of the constraint of the netlist results in a dead-end constraint condition. The trace file may be output as a testcase file for use in generating input vectors for testing an integrated circuit device associated with the netlist. Input vectors may be generated for use in a verification application for verifying an operation of an integrated circuit device associated with the netlist. A verification operation may be performed on the integrated circuit device using the verification application by applying the input vectors to inputs of the integrated circuit device.

Analyzing a netlist, for a constraint of the netlist, to identify a time step parameter associated with the constraint for use in identifying dead-end constraint conditions may comprise using an unfolding analysis to generate one or more functions indicative of which outputs of elements of the netlist and inputs to the netlist affect the constraint at particular time steps.

Moreover, analyzing a netlist, for a constraint of the netlist, to identify a time step parameter associated with the constraint for use in identifying dead-end constraint conditions may comprise determining, for each input to the netlist, a time step at which the input affects the value of the constraint, and selecting one of a greatest determined time step value or a least determined time step value to be the time step parameter. A time step parameter value may be selected such that the time step parameter is as small as possible yet sufficient to allow chosen values for inputs to the netlist to propagate to each constraint of the netlist.

Analyzing the netlist for a constraint of the netlist, to identify a time step parameter associated with the constraint for use in identifying dead-end constraint conditions may comprise unfolding the netlist to generate a directed graph of the unfolded netlist, and performing a depth-first graph traversal on the netlist based on one of a minimum depth heuristic or a maximum length acyclic path heuristic. The minimum depth heuristic may traverse the directed graph of the unfolded netlist to identify, for each input of the netlist, a minimum depth before an input value at time 0 affects the constraint. The maximum length acyclic path heuristic may determine, for each input, a maximum depth of a fan-in of the constraint before reaching an input.

The method may further comprise evaluating initial states of registers in the netlist by performing a constraint satisfaction evaluation for each constraint over a plurality of time steps equivalent to the time step parameter to ensure that chosen values for inputs will not result in the constraint being in a dead-end constraint condition. Simulating the netlist for a predetermined number of time steps may comprise computing, for each time-step of the simulation, a legal set of one or more inputs to apply to the netlist by performing a constraint satisfaction evaluation for the constraint of the netlist, for a plurality of time steps equivalent to the time step parameter, to ensure that chosen values for the one or more inputs will not cause the constraint to reach a dead-end constraint condition. The legal set of one or more inputs may be recorded in a trace file.

In other illustrative embodiments, a computer program product comprising a computer useable medium having a computer readable program is provided. The computer readable program, when executed on a computing device, causes the computing device to perform various ones, and combinations of, the operations outlined above with regard to the method illustrative embodiment.

In yet another illustrative embodiment, a system is provided. The system may comprise a processor and a memory coupled to the processor. The memory may comprise instructions which, when executed by the processor, cause the processor to perform various ones, and combinations of, the operations outlined above with regard to the method illustrative embodiment.

These and other features and advantages of the present invention will be described in, or will become apparent to those of ordinary skill in the art in view of, the following detailed description of the exemplary embodiments of the present invention.

BRIEF DESCRIPTION OF THE DRAWINGS

The invention, as well as a preferred mode of use and further objectives and advantages thereof, will best be understood by reference to the following detailed description of illustrative embodiments when read in conjunction with the accompanying drawings, wherein:

FIG. 3A is an exemplary netlist for explaining exemplary aspects of the illustrative embodiments;

FIG. 3B is an exemplary diagram illustrating an example of an unfolding algorithm that may be utilized with the illustrative embodiments;

FIGS. 3C and 3D illustrate an unfolding operation on a netlist in accordance with the example algorithm shown in FIG. 3B;

FIG. 4A illustrates unfolded logical expressions produced through an unfolding analysis of the original netlist shown in FIG. 3A with regard to initial states;

FIG. 4B is an exemplary diagram illustrating a circuit in which there is an input in the initial value logic and thus, the value of that input at cycle 0 is relevant to an input register;

FIG. 4C is an exemplary diagram illustrating a circuit in which multiple cyclic paths from input I_1 to constraint C exist;

FIG. 5 is an example of code that may be used to perform a simulation of the netlist under dead-end constraints;

FIG. 6 is an example of code that may be used to perform the K value determination according to one illustrative embodiment;

FIG. 7 is an exemplary block diagram of the primary operational components of an analysis engine in accordance with one illustrative embodiment;

DETAILED DESCRIPTION OF THE ILLUSTRATIVE EMBODIMENTS

The illustrative embodiments provide a mechanism for generating constraint-preserving testcases in the presence of dead-end constraints. The illustrative embodiments may be implemented in a single data processing system or may be distributed across a plurality of data processing systems that are coupled to one another via one or more communications networks. For example, a server computing device may provide a circuit model analysis engine that may operate on circuit models provided by other computing devices, such as client computing device. A client computing device may communicate with the server computing device via one or more communications networks so as to control the application of circuit model analysis, in accordance with the illustrative embodiments. The circuit models themselves may be provided initially as Hardware Description Language (HDL) files and converted to one or more netlist data structures, for example. Alternatively, the circuit models and circuit model analysis engine may be provided entirely on the same computing device such that multiple computing devices and communication networks are not necessary. For purposes of the present description, however, it will be assumed that the illustrative embodiments are implemented in a distributed data processing system in which multiple computing devices are utilized.

Figure 1:
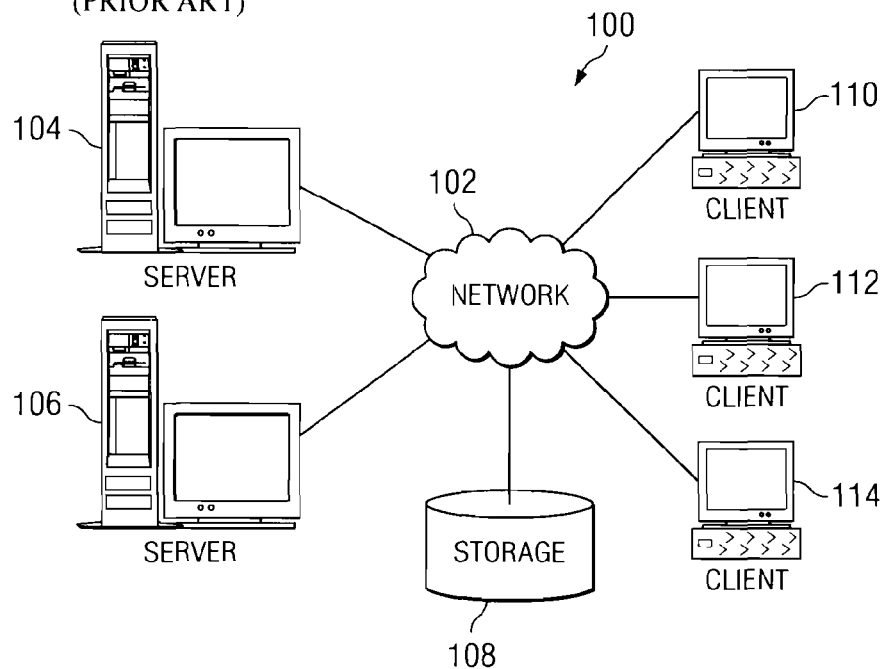
FIG. 1 is an exemplary diagram depicting a pictorial representation of an exemplary distributed data processing system in which aspects of the illustrative embodiments may be implemented.
Figure 2:
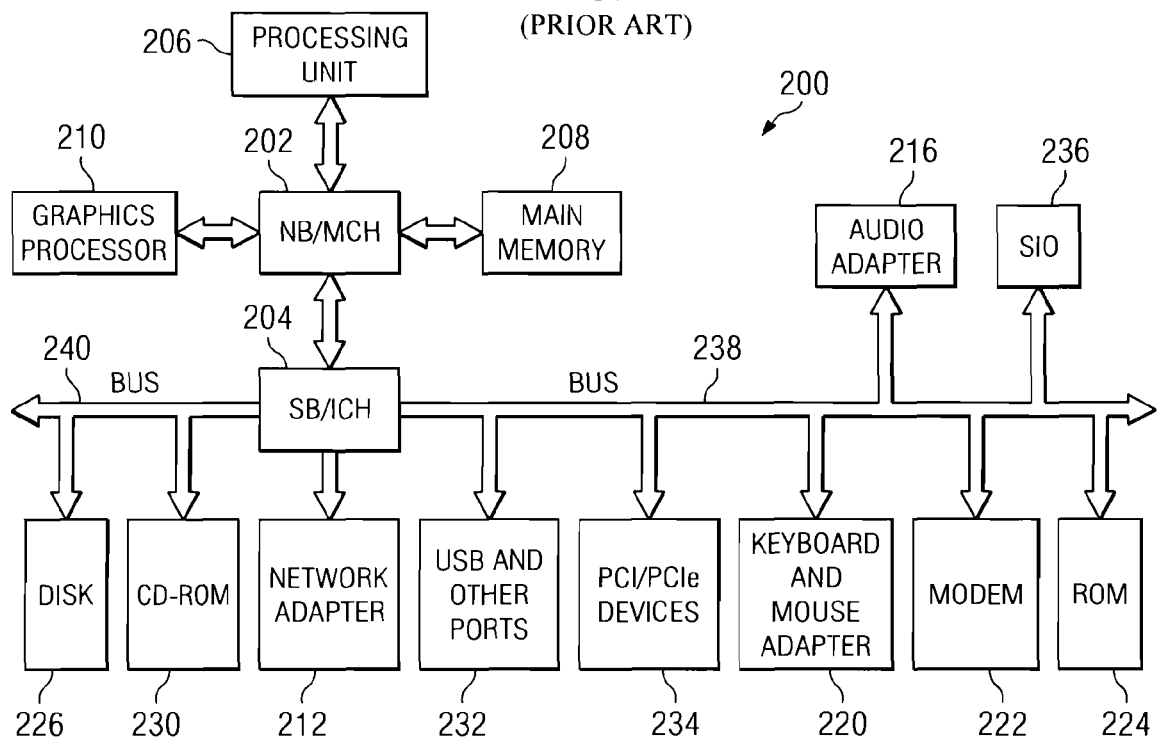
FIG. 2 is a block diagram of an exemplary data processing system in which aspects of the illustrative embodiments may be implemented.

With reference now to the figures and in particular with reference to FIGS. 1-2, exemplary diagrams of data processing environments are provided in which embodiments of the present invention may be implemented. It should be appreciated that FIGS. 1-2 are only exemplary and are not intended to assert or imply any limitation with regard to the environments in which aspects or embodiments of the present invention may be implemented. Many modifications to the depicted environments may be made without departing from the spirit and scope of the present invention.

With reference now to the figures, FIG. 1 depicts a pictorial representation of an exemplary distributed data processing system in which aspects of the illustrative embodiments may be implemented. Distributed data processing system 100 may include a network of computers in which embodiments of the illustrative embodiments may be implemented. The distributed data processing system 100 contains at least one network 102, which is the medium used to provide communication links between various devices and computers connected together within distributed data processing system 100. The network 102 may include connections, such as wire, wireless communication links, or fiber optic cables.

In the depicted example, server 104 and server 106 are connected to network 102 along with storage unit 108. In addition, clients 110, 112, and 114 are also connected to network 102. These clients 110, 112, and 114 may be, for example, personal computers, network computers, or the like. In the depicted example, server 104 provides data, such as boot files, operating system images, and applications to the clients 110, 112, and 114. Clients 110, 112, and 114 are clients to server 104 in the depicted example. Distributed data processing system 100 may include additional servers, clients, and other devices not shown.

In the depicted example, distributed data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 100 may also be implemented to include a number of different types of networks, such as for example, an intranet, a local area network (LAN), a wide area network (WAN), or the like. As stated above, FIG. 1 is intended as an example, not as an architectural limitation for different embodiments of the present invention, and therefore, the particular elements shown in FIG. 1 should not be considered limiting with regard to the environments in which the illustrative embodiments of the present invention may be implemented.

With reference now to FIG. 2, a block diagram of an exemplary data processing system is shown in which aspects of the illustrative embodiments may be implemented. Data processing system 200 is an example of a computer, such as server 104 or client 110 in FIG. 1, in which computer usable code or instructions implementing the processes for illustrative embodiments of the present invention may be located.

In the depicted example, data processing system 200 employs a hub architecture including north bridge and memory controller hub (NB/MCH) 202 and south bridge and input/output (I/O) controller hub (SB/ICH) 204. Processing unit 206, main memory 208, and graphics processor 210 are connected to NB/MCH 202. Graphics processor 210 may be connected to NB/MCH 202 through an accelerated graphics port (AGP).

In the depicted example, local area network (LAN) adapter 212 connects to SB/ICH 204. Audio adapter 216, keyboard and mouse adapter 220, modem 222, read only memory (ROM) 224, hard disk drive (HDD) 226, CD-ROM drive 230, universal serial bus (USB) ports and other communication ports 232, and PCI/PCIe devices 234 connect to SB/ICH 204 through bus 238 and bus 240. PCI/PCIe devices may include, for example, Ethernet adapters, add-in cards, and PC cards for notebook computers. PCI uses a card bus controller, while PCIe does not. ROM 224 may be, for example, a flash binary input/output system (BIOS).

HDD 226 and CD-ROM drive 230 connect to SB/ICH 204 through bus 240. HDD 226 and CD-ROM drive 230 may use, for example, an integrated drive electronics (IDE) or serial advanced technology attachment (SATA) interface. Super I/O (SIO) device 236 may be connected to SB/ICH 204.

An operating system runs on processing unit 206. The operating system coordinates and provides control of various components within the data processing system 200 in FIG. 2. As a client, the operating system may be a commercially available operating system such as Microsoft® Windows® XP (Microsoft and windows are trademarks of Microsoft Corporation in the United States, other countries, or both). An object-oriented programming system, such as the Java™ programming system, may run in conjunction with the operating system and provides calls to the operating system from Java™ programs or applications executing on data processing system 200 (Java is a trademark of Sun Microsystems, Inc. in the United States, other countries, or both).

As a server, data processing system 200 may be, for example, an IBM® eserver™ pSeries® computer system, running the Advanced Interactive Executive (AIX®) operating system or the LINUX® operating system (eServer, pSeries and AIX are trademarks of International Business Machines Corporation in the United States, other countries, or both while LINUX is a trademark of Linus Torvalds in the United States, other countries, or both). Data processing system 200 may be a symmetric multiprocessor (SMP) system including a plurality of processors in processing unit 206. Alternatively, a single processor system may be employed.

Instructions for the operating system, the object-oriented programming system, and applications or programs are located on storage devices, such as HDD 226, and may be loaded into main memory 208 for execution by processing unit 206. The processes for illustrative embodiments of the present invention may be performed by processing unit 206 using computer usable program code, which may be located in a memory such as, for example, main memory 208, ROM 224, or in one or more peripheral devices 226 and 230, for example.

A bus system, such as bus 238 or bus 240 as shown in FIG. 2, may be comprised of one or more buses. Of course, the bus system may be implemented using any type of communication fabric or architecture that provides for a transfer of data between different components or devices attached to the fabric or architecture. A communication unit, such as modem 222 or network adapter 212 of FIG. 2, may include one or more devices used to transmit and receive data. A memory may be, for example, main memory 208, ROM 224, or a cache such as found in NB/MCH 202 in FIG. 2.

Those of ordinary skill in the art will appreciate that the hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. Also, the processes of the illustrative embodiments may be applied to a multiprocessor data processing system, other than the SMP system mentioned previously, without departing from the spirit and scope of the present invention.

Moreover, the data processing system 200 may take the form of any of a number of different data processing systems including client computing devices, server computing devices, a tablet computer, laptop computer, telephone or other communication device, a personal digital assistant (PDA), or the like. In some illustrative examples, data processing system 200 may be a portable computing device which is configured with flash memory to provide non-volatile memory for storing operating system files and/or user-generated data, for example. Essentially, data processing system 200 may be any known or later developed data processing system without architectural limitation.

The illustrative embodiments provide a system and method for generating constraint-preserving testcases in the presence of dead-end constraints. The mechanisms of the illustrative embodiments use a sliding window of time-steps for which a net's constraints are evaluated in order to determine if a dead-end constraint may be encountered. By identifying a dead-end constraint early, the input to the net may be adjusted so as to avoid violation of the constraint. In this way, the mechanisms of the illustrative embodiments may be used to verify the circuit model provided to the circuit model analysis tools even when the nets of the circuit model may have dead-end constraints.

With reference again to FIG. 1, the server 104 may provide an analysis engine in accordance with the mechanisms of the illustrative embodiments. A client computing device, such as client 110, may provide a circuit model to the server 104 upon which the analysis engine of server 104 is to operate in order to verify the design of the circuit. This circuit model may comprise, for example, a netlist data structure defining the various nets of the circuit model.

Thus, with the mechanisms of the illustrative embodiments, a netlist is first defined. The netlist contains a directed graph with vertices representing gates and edges representing interconnections between gates. The gates have associated functions, such as constants, primary inputs, combinational logic (such as AND gates), and sequential elements (hereafter referred to as registers). Registers have two associated components: their next-state functions and their initial-value functions. Both are represented as other gates in the directed graph of the netlist.

Semantically, for a given register, the value appearing at its initial-value gate at time "0," i.e. the initialization or reset time, is applied as the value of the register itself. The value appearing at its next-state function gate at time "I" is applied to the register itself at time "i+1."

A "state" refers to valuations to the registers of a netlist. Those consistent with the initial values of registers are referred to as the "initial states." Certain gates are labeled as "targets" and/or "constraints." Targets correlate to the properties that are to be verified with the goal of the verification process being able to find a way to drive a "1" to a target node or to prove that no such assertion of the target is possible.

Constraints are used to "artificially" limit the stimulus that can be applied to the inputs of the circuit design. In particular, when searching for a way to drive a "1" to a target, the verification process must adhere to the rule that "every constraint gate must evaluate to a logical 1 for every time-step up to, and including, the time-step at which the target is asserted." For example, a constraint could be added which drives a 1 exactly when a vector of inputs evaluates to even parity. Without this constraint, the verification tool may consider valuations with even or odd parity to those inputs. With the constraint, only even parity valuations to the inputs are explored. Constraints, therefore, may be viewed as "invalidating" traces (0, 1, valuations to gates over time) at, and beyond, time-steps at which any constraint gate evaluates to 0. This phenomenon is referred to as the "trace-prefixing" effect of constraints.

Dead-end constraints are a particular type of constraints which are sequential in nature, i.e. the constraint gate has registers in its cone of influence. Dead-end constrains refer to constraints that entail states for which no legal input stimulus exists. To illustrate the issues associated with generating testcases for dead-end constraints, consider the following simple constraint:

I_1→[R_1]→[R_2]→[R_3]→C where I_1 is the primary input and R_1, R_2, and R_3 are registers with an initial value of constant_1. The output of register R_3 is labeled as constraint C meaning that the output of R_3 should always be the value C, e.g., constant_1.

Known approaches address testcase generation, for constraint satisfying simulation, by the simple algorithm: given the current state S_j of the netlst, compute a set of current valuations to primary inputs I_j which will satisfy the constraints from state S_j. While this approach works well if the netlist has no dead-end constraints, this approach fails for netlists, such as the example set forth above, which do have dead-end constraints.

For example, consider the initial state of the netlist example above at time 0. Constraint C is trivially satisfied regardless of input valuations since the initial value of register R_3 is constant_1. The known approach may assign input I_1 to either 0 or 1. If it is assigned 0, then the netlist will reach a dead-end state (R_3=0) 3 cycles later and constraint C will be unconditionally violated, i.e. C will no longer be constant_1. The reason that the netlist reached the dead-end state is because of the decision made to assign input I_1 to 0 three time steps before the violation. However, if the testcase generator had realized that assigning the input I_1 at cycle 0 would affect the constraint in cycle 3, then it would have chosen to assign I_1 to 1 instead of 0.

One benefit of the known approach to testcase generation is that it is computationally inexpensive; even if doing a 10,000 time-step simulation, the result is basically no more expensive than performing 10,000 individual one-step simulations. However, the weakness of the known approach is that it is prone to causing bad decisions that contradict or violate constraints leading to dead-end constraints in the future, i.e. setting inputs such that a dead-end is again encountered.

In contrast, a purely formal solution would be to directly use satisfiability algorithms to generate only legal input stimulus for the entire duration of the simulation, i.e. if a 10,000 time step simulation is desired, the algorithm would rely solely upon satisfiability algorithms to analyze the constraints for 10,000 time steps, randomizing only the non-critical input assignments. While this approach is exact in that it will never make a decision that contradicts or violates dead-end constraints in the future, it is computationally intractable since temporal satisfiability solving is known to become exponentially more complex as the range of the check progresses. Thus, a hybrid solution is needed to balance precision in not making bad decisions that contradict dead-end constraints and computational expense.

To help compensate for the weaknesses of known approaches, one improvement made by the illustrative embodiments is to solve for the constraints for the next K time-steps at every state of the netlist instead of just trying to solve the constraint for the present time-step. For example, in the above example netlist, the illustrative embodiments solve constraint C for 4 time-steps at every state, not only for the current time-step but for the subsequent 3 time steps. With the above netlist example, this would prevent the testcase generation algorithm from ever assigning I1 to a 0 input value. However, it should be noted that this is still a sliding window approach in that even if a 10,000 time step simulation is desired, no constraint solving is performed which spans more than 4 time steps. Instead, 10,000 "constraint solving" are performed, each of which spans at most 4 time steps.

The selection of a K value, i.e. a number of time-steps for which to solve for the constraints at every state of the netlist, is made so as to balance computational efficiency (which mandates a small K value) versus precision of avoiding dead-end states (which mandates a sufficiently large K). The illustrative embodiments use an unfolding analysis to analyze the function of a netlist constraint over time.

To understand the issues related to selecting a K value for each constraint, it is beneficial to consider an example netlist as shown in FIG. 3A. As shown in FIG. 3A, the netlist includes three inputs I_1, I_2, and I_3, four registers R_1 R_2 R_3, and R_4, and two AND gates A_1 and A_2. For simplicity, it is assumed that the initial value of all the registers is constant_1.

An unfolding analysis is utilized to analyze the function of constraint C over time. Unfolding converts a synchronous circuit into a combinational circuit which produces the same outputs as the synchronous circuit for some number "k" cycles, where k is the "unfolding depth." A netlist, which contains a directed graph with vertices representing gates and edges representing interconnections between gates, is first provided. The gates have associated functions, such as constants, primary inputs, combinational logic (such as AND gates, OR gates, and the like), and sequential elements, e.g., registers. Registers have two associated components their next-state functions and their initial-value functions. Both are represented as other gates in the directed graph of the netlist. Certain gates are labeled as "targets" and/or "constraints." As mentioned above, targets correlate to the properties that are to be verified with the goal of the verification process being to find a way to drive a "1" to a target node or to prove that no such assertion of the target is possible.

FIG. 3B illustrates an example unfolding algorithm that may be used to unfold a netlist in accordance with one illustrative embodiment. In the example algorithm, the function get_unfolded_circuit_node creates the "cycle i instance" of a node (input variable or AND-gate) in the unfolded circuit, if it does not already exist. In the case of an AND-gate, the function will recursively call itself to build the sources for the AND-gate, if necessary. The sources for an AND-gate input in the unfolded circuit are as follows:

(1) if the input (in the original circuit) is connected to an input variable, the input to the cycle i instance of the AND-gate is connected to the cycle i instance of the input variable;

(2) if the input is connected to another AND-gate, the input to the cycle i instance of the AND-gate is connected to the cycle i instance of the other AND-gate; and (3) if the input is driven by a register, then:
 (a) if i=0, the input to the cycle i instance of the AND-gate is connected to the initial state function of the register (which must not be a function of any register);
 (b) if i>0, the input to the cycle i instance of the AND-gate is connected to the cycle I−1 instance of the next-state function of the register.

In other words, a register is replaced by a "wire" in the unfolded circuit whose "output" in cycle i has the same value of its "input" in cycle I−1.

As an example, assume the input problem consists of the circuit as shown in FIG. 3C. In FIG. 3C, elements "Rx" (where x is a particular letter designator) represent a sequential element, e.g., register. Each "Ax" element represents an AND-gate. Each AND-gate has 2 inputs, an input variable and a register output.

FIG. 3D illustrates an example of an unfolded circuit corresponding to the circuit shown in FIG. 3C which has been unfolded for three cycles. In FIG. 3C, "Ixn" represents instance n of an input variable x. "Rx0" represents the initial state of register Rx, e.g., either constant 0 or constant 1. "Rxn" (n>0) represents the "wire" that connects the next state function of register Rx for cycle n−1 to the cycle n instance of the logic driven by register Rx. "Axn" represents instance n of AND-gate Ax. The netlist corresponding to FIG. 3D may be generated from the netlist corresponding to FIG. 3C using the example algorithm set forth in FIG. 3B, for example. This is one example of an unfolding analysis that may be utilized with the mechanisms of the illustrative embodiments. Other unfolding analysis mechanisms that may be known or later developed may be used without departing from the spirit and scope of the illustrative embodiments.

FIG. 4A illustrates the unfolded constraint netlist logical expressions produced through an unfolding analysis of the original netlist shown in FIG. 3A with regard to initial states. In the example shown in FIG. 4A, C(0) represents the unfolded time-0 representation of constraint C. "Init" refers to the initial value of the corresponding register. The logical expressions shown in FIG. 4A indicate the values of the logic elements that affect the value of the constraint C at various time-steps 0 to j.

The logical expressions set forth in FIG. 4A provide several insights into how to choose an appropriate K value. The goal is to assign valuations to the inputs I_1, I_2, and I_3 at cycle 0 such that constraints will not be subsequently violated. Input I_1 at time 0 affects the constraint C at time-step 1. Input I_2 at time 0 affects constraint C at time-step 3. Input I_3 at time 0 affects constraint C at time-step 4. More generally, input I_1 at time j affects constraint C at time-step j+1; input I_2 at time j affects constraint C at time j+3; and input I_3 at time j affects constraint C at time j+4.

In order to perform a K time-step simulation of the netlist in FIG. 3A, utilizing the corresponding unfolded logical expressions in FIG. 4A, the simulation must consider constraint-satisfying inputs for time-steps 0 to K−1. However, because the longest duration lifetime between the sampling of an input and the input affecting an output is 4 time-steps, the simulation needs at most 5 time-steps of unfolded analysis from any state to ensure that input valuations will satisfy constraints in the future.

Since the netlist shown in FIG. 3A, and the corresponding unfolded logical expressions in FIG. 4A, represent a simple feed-forward netlist, increasing K beyond 5 is not beneficial since none of the inputs at time j affect the constraint beyond time j+5. However, if there is a feedback loop in the netlist, it is possible that a single input at time j may affect constraints at multiple time-steps. It is also possible that an input may affect constraints indefinitely through the future. The only known way to handle such a situation is to use satisfiability algorithms to solve the constraints for the number of cycles to be simulated, however as noted above this can be too expensive a solution in practice. The mechanisms of the illustrative embodiments as described herein will still use the same heuristic when these situations arise, but if the heuristic does not work, i.e. an appropriate K value is not able to be determined, then nothing is done to generate the testcase for this situation. However, when compared to current testcase generation mechanisms, this is no worse than those known schemes. It should be noted that cases where the heuristic of the illustrative embodiments does not generate a solution have not yet been encountered in practice.

Moreover, it should be noted that in the above examples the initial values of all the registers are constants However, this may not always be the case. If there are inputs in the initial value cone, then the calculation of K will also consider the effects of valuations to inputs in the initial value cone.

For example, the registers in the netlist have two components associated with them, the initial value gate and the next state function gate. The value at the output of register at time 0 is the value of the initial value gate at time 0. Typically one thinks of initial values (reset values) as constants, either constant$_{0\ (Boolean}$ "0") or constant_1 (Boolean "1"). However initial value logic could be non-constants and may contain inputs. If there is an input in the initial value logic, then the value of that input at cycle 0 is relevant to the register. An example for the above statement is shown in FIG. 4B.

In FIG. 4B, R_3 is the constraint, R_3 is a register with next state function A_1 (AND gate) and initial value function constant_1 (Boolean "1"). A_1 has input I_1 and register R_2 as the two inputs. Register R_2 has register R_1 as next state function and constant_1 as initial value. Register R_1 has constant_1 as the next state function and I_2 as it is initial value. The value of K, when solving for inputs at cycle "0" is actually 3 because the value of I_2 at cycle "0" affects the value of the constraint at C at cycle 2. If inputs were not considered in the initial value cone, then value of K would be 2, I_1 at cycle 0 affects constraint C at cycle 1.

Based on the above observations of the effects on constraints at various time-steps, two heuristics have been developed and may be used by the illustrative embodiments in determining an appropriate value for K. First, it should be noted that when assigning values to a given input I_j, it is important to ensure that a K value that is used is as small as possible yet sufficient to allow the chosen values for I_j to propagate to each constraint C. Otherwise, values selected for that input may be prone to hitting dead-end states.

Second, it should be noted that it is possible that the values of certain inputs may influence a given constraint at multiple time-steps. For example, in the netlist of FIG. 3A, if I_1 and I_3 were actually the same input, then the same input would influence the constraint C at multiple time-steps, i.e. at time-steps 1 and 4 in the future. While the first heuristic would select K as 1, i.e. the shallowest sensitization, in the second heuristic the maximum number of state elements that can be passed through in the fan-in of C before reaching each given input, along simple paths that entail no cycles, is considered. If traversing through cyclic logic were allowed, the value of K would grow unboundedly.

Both of these heuristics may be satisfied by performing depth-first or breadth-first graph traversal algorithms for each netlist. For example, a depth-first or breadth-first graph traversal algorithm may encompass determining, for each input of a netlist, a depth parameter based on either a minimum depth heuristic or a maximum length acyclic path heuristic. Via a depth-first search of the netlist, it can be determined if there are multiple acyclic paths from an input to a constraint having different numbers of registers. If multiple acyclic paths from an input to a constraint having different number of registers exist, the maximum length acyclic path heuristic may be utilized. Otherwise, the minimum depth heuristic may be utilized.

The minimum depth heuristic traverses the directed graph of the unfolded netlist to identify, for each input, the minimum depth before an input value at time 0 affects a constraint. The maximum length acyclic path heuristic determines, for each input, the maximum depth of a fan-in of the constraint before reaching the input.

Looking at the example shown in FIG. 3A, the first heuristic would generate a depth value of 4 since, as shown in FIG. 4A, the input value for I_3 at time-step 0 affects the constraint at time-step 4. The second heuristic would also generate a depth value of 4. As a further example, consider the example circuit shown in FIG. 4C. As shown in FIG. 4C, there are multiple cyclic paths from input I_1 to constraint C. One path has a single register R_3, the other has three registers R_1, R_2, and R_3. The minimum depth heuristic will produce a K of 2. The maximum length acyclic heuristic will produce a K of 4. In the example shown in FIG. 4C, the minimum depth heuristic is chosen for use with the illustrative embodiments, as discussed previously.

The depth values for each input of the netlist are determined using one of the two heuristics. The greatest depth value of all of the inputs of the netlist may then be selected as the depth value for the netlist. This depth value is then used as the K value for identifying the width of the sliding window for constraint solving. FIG. 5 is an example of code that may be used to perform the K value determination according to one illustrative embodiment.

Having determined a K value for the sliding window for constraint solving for the netlist, the K value may be used to simulate the netlist under dead-end constraints. FIG. 6 is an example of code that may be used to perform a simulation of the netlist under dead-end constraints.

As shown in FIG. 6, the simulation creates a trace T of valuations of signals over time. For each constraint in the netlist, the simulation evaluates the initial state definitions of registers in the netlist by performing a K-step constraint satisfaction evaluation for each constraint to ensure that chosen values to inputs will not violate dead-end constraints in the future. The simulation records its selected input valuations in the trace T. If a dead-end constraint is violated, then the simulation cannot proceed and the violation is reported back to the user with the trace showing how the dead-end constraint was violated. Essentially, the initial evaluation performed by the simulation is an unfolding of the netlist relative to the initial states.

The simulation then, for each time-step of the simulation, computes a legal set of inputs to apply to the netlist at each time-step by performing a K-step constraint satisfaction evaluation for each constraint C to ensure that chosen values for inputs will not violate dead-end constraints in the future. This constraint satisfaction evaluation is performed by applying satisfaction (SAT) algorithms to a K-step unfolding of the constraints from the state in trace T at time i. The selected input valuations are then recorded in the trace T. Essentially, the constraint satisfaction evaluation involves an unfolding relative to the 0, 1 current state valuations of registers at time i in trace T.

These two evaluations of legal inputs, i.e. the initial evaluation and the evaluations for each time step, are provided because of the fact that the K value needed to properly assign valuations to inputs in the initial value cone is different from the K value needed to properly assign valuations to inputs in the next state cone.

For example, consider again the circuit shown in FIG. 4B. In the circuit shown in FIG. 4B, the K value required to correctly assign input I_2 at cycle 0 is 3. However, to properly assign input I_1 for cycle 0 and higher, the K value is 2. It should be noted that only an assignment to input I_2 at cycle 0 needs to be found in this case (the value of I_2 is not relevant to the constraint C at cycles>0). If the value of K is set to 3 for the computations during all cycles, more work is being done than is necessary because the algorithm need only set K to 2 for cycles>0.

Thus, the illustrative embodiments provide a mechanism for defining a sliding window for constraint solving during simulation of a netlist. This sliding window is defined by determining a window width comprising a number of time-steps in the future of a simulation for which an input is to be evaluated to determine if it will violate any dead-end constraints. If a dead-end constraint will be violated in the future, the input valuation may be modified to ensure that the dead-end constraint will not be violated during the simulation to generate the trace. This trace may then be used as a testcase for testing the operation of the integrated circuit device with which the netlist is associated.

FIG. 7 is an exemplary block diagram of the primary operational components of an analysis engine in accordance with one illustrative embodiment. As shown in FIG. 7, the analysis engine 700 includes a controller 710, an interface 720, an unfolding module 730, a minimum length path determination engine 740, an acyclic path maximum length determination engine 750, a simulation engine 760, and a trace storage module 770. The elements 710-770 of the analysis engine 700 may be implemented in either hardware, software, or any combination of hardware and software. In one illustrative embodiment, the elements 710-770 are implemented as software instructions executed by one or more processors.

The controller 710 controls the overall operation of the analysis engine 700 and orchestrates the operation of the other elements 720-770. The controller 710 receives a circuit model, including, for example, a netlist data structure, via the interface 720 which may be a user interface, a network interface, and/or the like. The controller 710 provides the netlist data structure to the simulation engine 760 which operates on the netlist data structure to generate a trace that is stored in trace storage module 770.

The simulation engine 760 may invoke the unfolding module 730 to unfold nets in the netlist so that the minimum length path determination engine 740 and/or the acyclic path maximum length determination engine 750 may operate on the unfolded nets to determine a depth value for the netlist. This depth-value is then utilized as the sliding window width value K for identifying a number of time-steps in the future of the simulation for which the netlist's element states must be evaluated to determine if an input value violates dead-end constraints. The simulation engine may perform such analysis based on initial register values initially and then with each time-step of the simulation thereafter based on the inputs.

The resulting trace in the trace storage module 770 may then be output and used as a basis for establishing a testcase vector of inputs for testing the operation of an integrated circuit device corresponding to the netlist. Thus, the resulting testcase vectors may later be used in a verification system to verify the proper operation of the integrated circuit device.

Figure 8:
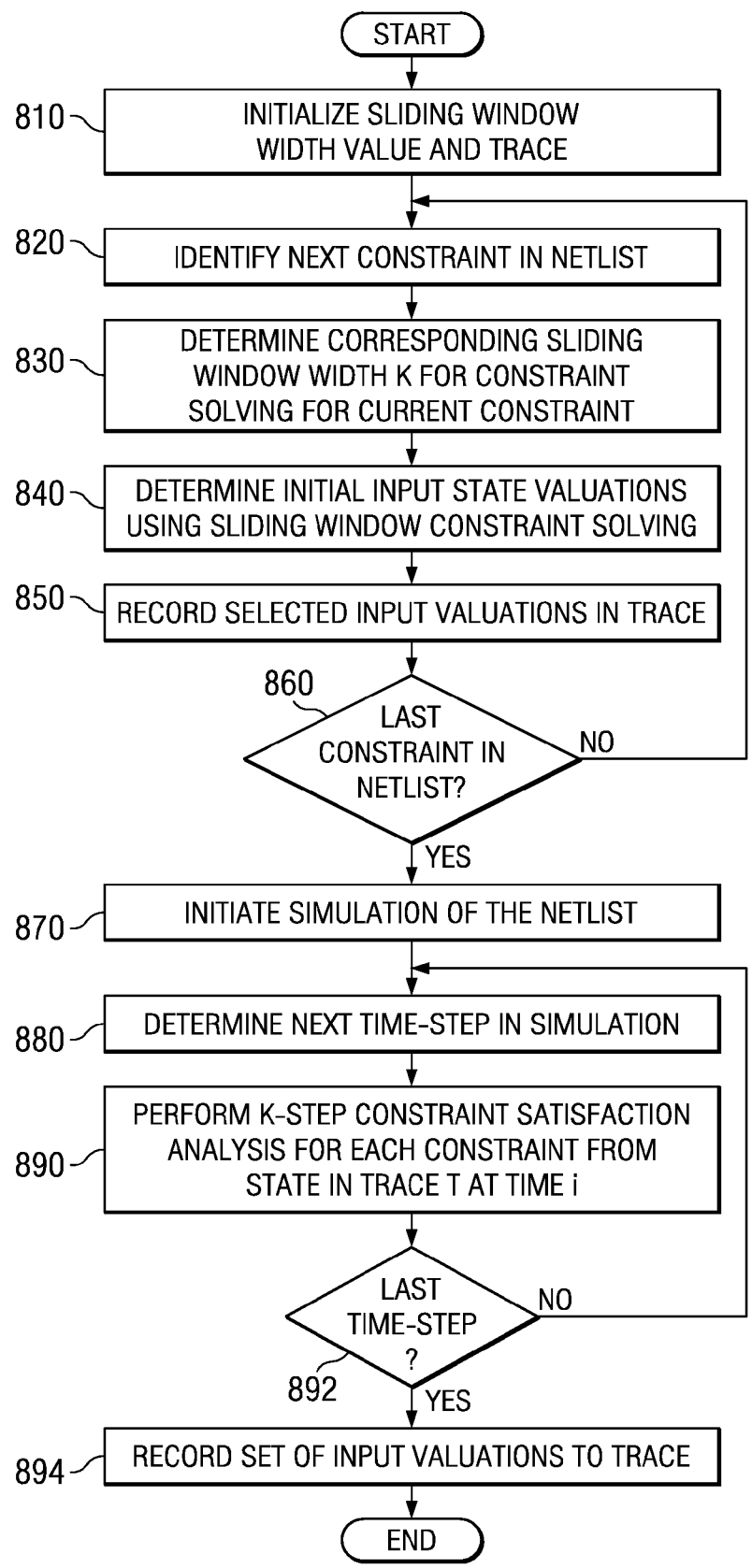
FIG. 8 is a flowchart outlining an exemplary operation for simulating a netlist under dead end constraints in accordance with one illustrative embodiment.
Figure 9:
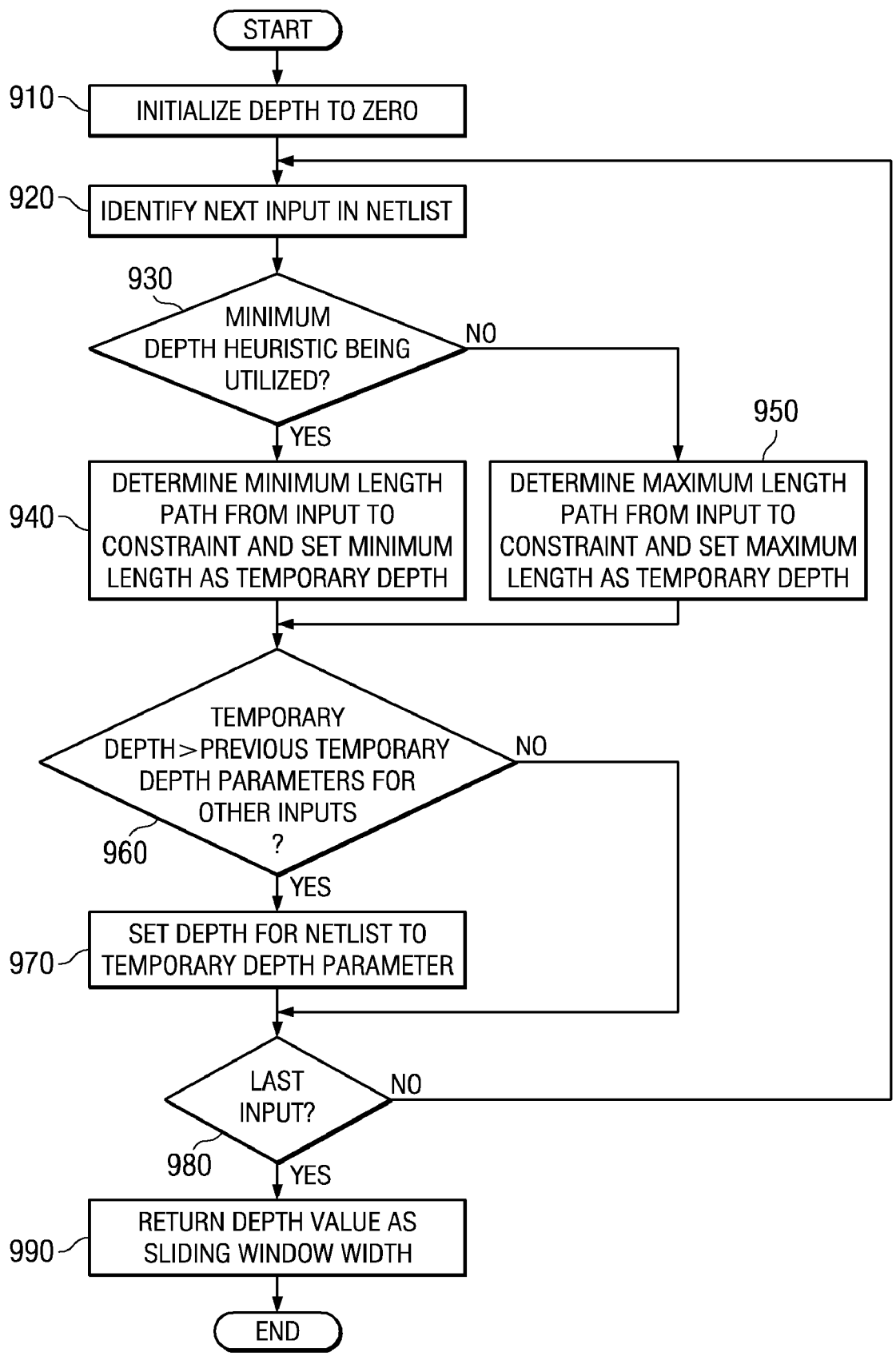
FIG. 9 is a flowchart outlining an exemplary operation for determining a sliding window width for constraint solving in accordance with one illustrative embodiment.

FIGS. 8 and 9 are exemplary flowcharts outlining exemplary operations of one illustrative embodiment. It will be understood that each block of the flowchart illustrations, and combinations of blocks in the flowchart illustrations, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustrations support combinations of means for performing the specified functions, combinations of steps for performing the specified functions and program instruction means for performing the specified functions. It will also be understood that each block of the flowchart illustrations, and combinations of blocks in the flowchart illustrations, can be implemented by special purpose hardware-based computer systems which perform the specified functions or steps, or by combinations of special purpose hardware and computer instructions.

Furthermore, the flowcharts are provided to demonstrate the operations performed within the illustrative embodiments. The flowcharts are not meant to state or imply limitations with regard to the specific operations or, more particularly, the order of the operations. The operations of the flowcharts may be modified to suit a particular implementation without departing from the spirit and scope of the present invention.

FIG. 8 is a flowchart outlining an exemplary operation for simulating a netlist under dead-end constraints in accordance with one illustrative embodiment. As shown in FIG. 8, the operation starts with the analysis engine initializing a sliding window width value and a trace for the netlist (step 810). The analysis engine then identifies a next constraint in the netlist (step 820) and determines a corresponding sliding window width K for constraint solving (step 830). Based on initial state definitions of registers in the netlist, the analysis engine determines initial input state valuations using the sliding window constraint solving to ensure that input values will not violate dead-end constraint in the future (step 840). The analysis engine records the selected input valuations as part of the trace (step 850). The analysis engine then determines if this is the last constraint in the netlist (step 860). If not, the operation returns to step 820.

If this was the last constraint in the netlist, the analysis engine initiates a simulation of the netlist (step 870). The analysis engine determines a next time-step (step 880) and performs a K-step constraint satisfaction analysis for each constraint C by unfolding the constraints from the state in trace T at time i in order to ensure that chosen input values will not violate dead end constraints (step 890) The analysis engine determines if this is the last time-step (step 892) and if not, returns to step 880. If this is the last time-step, the resulting set of input valuations are recorded to the trace (step 894) and the operation terminates.

FIG. 9 is a flowchart outlining an exemplary operation for determining a sliding window width for constraint solving in accordance with one illustrative embodiment. The operation outlined in FIG. 9 may be performed, for example, as part of step 830 in FIG. 8.

As shown in FIG. 9, the operation starts with the analysis engine initializing a depth to 0 (step 910). The analysis engine identifies a next input in the netlist (step 920). The analysis engine determines if a minimum depth heuristic is being utilized with this input (step 930). If so, then the analysis engine determines a minimum length path from the input to the constraint and sets the minimum length as a temporary depth parameter (step 940). If the minimum depth heuristic is not being utilized, then the analysis engine determines a maximum length path from the input to the constraint and sets the temporary depth parameter equal to the determined maximum length (step 950).

The analysis engine then determines if the temporary depth parameter is greater than previous temporary depth parameters for other inputs of the netlist (step 960). If so, the analysis engine sets the depth for the netlist equal to the temporary depth parameter (step 970). Thereafter, or if the temporary depth parameter is not greater than previous temporary depth parameters for other inputs of the netlist, the analysis engine determines if this is the last input for the netlist (step 980). If this is not the last input for the netlist, the operation returns to step 920. Otherwise, the depth value for the netlist is returned (step 990) and the operation terminates.

Thus, the illustrative embodiments provide a sliding window approach to determining if an input to a netlist will generate a violation of a dead-end constraint during simulation of the netlist. This sliding window is applied at each time-step of the simulation. If it is determined via the sliding window approach that a particular input may cause a violation of a dead end constraint, then an alternative input may be selected for use in testcases for testing the operation of an integrated circuit device corresponding to the netlist.

It should be appreciated that the illustrative embodiments may take the form of an entirely hardware embodiment, an entirely software embodiment or an embodiment containing both hardware and software elements. In one exemplary embodiment, the mechanisms of the illustrative embodiments are implemented in software, which includes but is not limited to firmware, resident software, microcode, etc.

Furthermore, the illustrative embodiments may take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

The medium may be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for adjusting input values of testcases in the presence of dead-end constraints, comprising:

analyzing, by a processor of the data processing system, a netlist stored in a storage device associated with the data processing system, for a constraint of the netlist, to identify a time step parameter associated with the constraint for use in identifying dead-end constraint conditions;

simulating, by the processor, the netlist for a predetermined number of time steps;

evaluating, at each time step, a state of elements of the netlist for a period of time steps in the future of the simulation, based on the time step parameter;

determining, by the processor, whether a value associated with the constraint of the netlist results in a dead-end constraint condition for one or more of the time steps in the future; and adjusting, by the processor, an input to the netlist in response to the value associated with the constraint of the netlist resulting in a dead-end constraint condition.

2. The method of claim 1, further comprising:

recording, by the processor, the input to the netlist in a trace file, in the storage device, in response to the value of the constraint of the netlist not resulting in a dead-end constraint condition; and recording, by the processor, the adjusted input to the netlist in the trace file in response to the value of the constraint of the netlist resulting in a dead-end constraint condition.

3. The method of claim 2, further comprising:

outputting, by the processor, the trace file as a testcase file to the storage device for use in generating input vectors for testing an integrated circuit device associated with the netlist.

4. The method of claim 3, further comprising:

generating, by the processor, input vectors for use in a verification application for verifying an operation of an integrated circuit device associated with the netlist; and performing, by the processor, a verification operation on the integrated circuit device using the verification application by applying the input vectors to inputs of the integrated circuit device.

5. The method of claim 1, wherein analyzing a netlist, for a constraint of the netlist, to identify a time step parameter associated with the constraint for use in identifying dead-end constraint conditions comprises using an unfolding analysis to generate one or more functions indicative of which outputs of elements of the netlist and inputs to the netlist affect the constraint at particular time steps.

6. The method of claim 1, wherein analyzing a netlist, for a constraint of the netlist, to identify a time step parameter associated with the constraint for use in identifying dead-end constraint conditions comprises:

determining, for each input to the netlist, a time step at which the input affects the value of the constraint; and selecting one of a greatest determined time step value or a least determined time step value to be the time step parameter.

7. The method of claim 1, wherein analyzing the netlist for a constraint of the netlist, to identify a time step parameter associated with the constraint for use in identifying dead-end constraint conditions comprises:

selecting a time step parameter value that is as small as possible yet sufficient to allow chosen values for inputs to the netlist to propagate to each constraint of the netlist.

8. The method of claim 1, wherein analyzing the netlist for a constraint of the netlist, to identify a time step parameter associated with the constraint for use in identifying dead-end constraint conditions comprises:

unfolding the netlist to generate a directed graph of the unfolded netlist; and performing a depth-first graph traversal on the netlist based on one of a minimum depth heuristic or a maximum length acyclic path heuristic, wherein the minimum depth heuristic traverses the directed graph of the unfolded netlist to identify, for each input of the netlist, a minimum depth before an input value at time 0 affects the constraint, and wherein the maximum length acyclic path heuristic determines, for each input, a maximum depth of a fan-in of the constraint before reaching an input.

9. The method of claim 1, further comprising:
evaluating initial states of registers in the netlist by performing a constraint satisfaction evaluation for each constraint over a plurality of time steps equivalent to the time step parameter to ensure that chosen values for inputs will not result in the constraint being in a dead-end constraint condition.

10. The method of claim 9, wherein simulating the netlist for a predetermined number of time steps comprises:
computing, for each time-step of the simulation, a legal set of one or more inputs to apply to the netlist by performing a constraint satisfaction evaluation for the constraint of the netlist, for a plurality of time steps equivalent to the time step parameter, to ensure that chosen values for the one or more inputs will not cause the constraint to reach a dead-end constraint condition; and
recording the legal set of one or more inputs in a trace file in the storage device.

11. A computer program product comprising a computer recordable medium having a computer readable program recorded thereon, wherein the computer readable program, when executed on a computing device, causes the computing device to:
analyze a netlist, for a constraint of the netlist, to identify a time step parameter associated with the constraint for use in identifying dead-end constraint conditions;
simulate the netlist for a predetermined number of time steps;
evaluate, at each time step, a state of elements of the netlist for a period of time steps in the future of the simulation, based on the time step parameter;
determine whether a value associated with the constraint of the netlist results in a dead-end constraint condition for one or more of the time steps in the future; and
adjust an input to the netlist in response to the value associated with the constraint of the netlist resulting in a dead-end constraint condition.

12. The computer program product of claim 11, wherein the computer readable program further causes the computing device to:
record the input to the netlist in a trace file in response to the value of the constraint of the netlist not resulting in a dead-end constraint condition; and
record the adjusted input to the netlist in a trace file in response to the value of the constraint of the netlist resulting in a dead-end constraint condition.

13. The computer program product of claim 12, wherein the computer readable program further causes the computing device to:
output the trace file as a testcase file for use in generating input vectors for testing an integrated circuit device associated with the netlist.

14. The computer program product of claim 13, wherein the computer readable program further causes the computing device to:
generate input vectors for use in a verification application for verifying an operation of an integrated circuit device associated with the netlist; and
perform a verification operation on the integrated circuit device using the verification application by applying the input vectors to inputs of the integrated circuit device.

15. The computer program product of claim 11, wherein the computer readable program causes the computing device to analyze a netlist, for a constraint of the netlist, to identify a time step parameter associated with the constraint for use in identifying dead-end constraint conditions by using an unfolding analysis to generate one or more functions indicative of which outputs of elements of the netlist and inputs to the netlist affect the constraint at particular time steps.

16. The computer program product of claim 11, wherein the computer readable program causes the computing device to analyze a netlist, for a constraint of the netlist, to identify a time step parameter associated with the constraint for use in identifying dead-end constraint conditions by:
determining, for each input to the netlist, a time step at which the input affects the value of the constraint; and
selecting one of a greatest determined time step value or a least determined time step value to be the time step parameter.

17. The computer program product of claim 11, wherein the computer readable program causes the computing device to analyze the netlist for a constraint of the netlist, to identify a time step parameter associated with the constraint for use in identifying dead-end constraint conditions by:
selecting a time step parameter value that is as small as possible yet sufficient to allow chosen values for inputs to the netlist to propagate to each constraint of the netlist.

18. The computer program product of claim 11, wherein the computer readable program causes the computing device to analyze the netlist for a constraint of the netlist, to identify a time step parameter associated with the constraint for use in identifying dead-end constraint conditions by:
unfolding the netlist to generate a directed graph of the unfolded netlist; and
performing a depth-first graph traversal on the netlist based on one of a minimum depth heuristic or a maximum length acyclic path heuristic, wherein the minimum depth heuristic traverses the directed graph of the unfolded netlist to identify, for each input of the netlist, a minimum depth before an input value at time 0 affects the constraint, and wherein the maximum length acyclic path heuristic determines, for each input, a maximum depth of a fan-in of the constraint before reaching an input.

19. The computer program product of claim 11, wherein the computer readable program further causes the computing device to:
evaluate initial states of registers in the netlist by performing a constraint satisfaction evaluation for each constraint over a plurality of time steps equivalent to the time step parameter to ensure that chosen values for inputs will not result in the constraint being in a dead-end constraint condition.

20. The computer program product of claim 19, wherein the computer readable program causes the computing device to simulate the netlist for a predetermined number of time steps by:
computing, for each time-step of the simulation, a legal set of one or more inputs to apply to the netlist by performing a constraint satisfaction evaluation for the constraint of the netlist, for a plurality of time steps equivalent to the time step parameter, to ensure that chosen values for the one or more inputs will not cause the constraint to reach a dead-end constraint condition; and
recording the legal set of one or more inputs in a trace file.

21. A system, comprising:
a processor; and
a memory coupled to the processor, wherein the memory comprises instructions which, when executed by the processor, cause the processor to:
analyze a netlist, for a constraint of the netlist, to identify a time step parameter associated with the constraint for use in identifying dead-end constraint conditions;
simulate the netlist for a predetermined number of time steps;
evaluate, at each time step, a state of elements of the netlist for a period of time steps in the future of the simulation, based on the time step parameter;
determine whether a value associated with the constraint of the netlist results in a dead-end constraint condition for one or more of the time steps in the future; and
adjust an input to the netlist in response to the value associated with the constraint of the netlist resulting in a dead-end constraint condition.

22. The system of claim 21, wherein the instructions further cause the processor to:
record the input to the netlist in a trace file in response to the value of the constraint of the netlist not resulting in a dead-end constraint condition; and
record the adjusted input to the netlist in a trace file in response to the value of the constraint of the netlist resulting in a dead-end constraint condition.

23. The system of claim 22, wherein the instructions further cause the processor to:
output the trace file as a testcase file for use in generating input vectors for testing an integrated circuit device associated with the netlist.

24. The system of claim 23, wherein the instructions further cause the processor to:
generate input vectors for use in a verification application for verifying an operation of an integrated circuit device associated with the netlist; and
perform a verification operation on the integrated circuit device using the verification application by applying the input vectors to inputs of the integrated circuit device.

25. The system of claim 21, wherein the instructions cause the processor to analyze a netlist, for a constraint of the netlist, to identify a time step parameter associated with the constraint for use in identifying dead-end constraint conditions by using an unfolding analysis to generate one or more functions indicative of which outputs of elements of the netlist and inputs to the netlist affect the constraint at particular time steps.

26. The system of claim 21, wherein the instructions cause the processor to analyze a netlist, for a constraint of the netlist, to identify a time step parameter associated with the constraint for use in identifying dead-end constraint conditions by:

determining, for each input to the netlist, a time step at which the input affects the value of the constraint; and
selecting one of a greatest determined time step value or a least determined time step value to be the time step parameter.

27. The system of claim 21, wherein the instructions cause the processor to analyze the netlist for a constraint of the netlist, to identify a time step parameter associated with the constraint for use in identifying dead-end constraint conditions by:
selecting a time step parameter value that is as small as possible yet sufficient to allow chosen values for inputs to the netlist to propagate to each constraint of the netlist.

28. The system of claim 21, wherein the instructions cause the processor to analyze the netlist for a constraint of the netlist, to identify a time step parameter associated with the constraint for use in identifying dead-end constraint conditions by:
unfolding the netlist to generate a directed graph of the unfolded netlist; and
performing a depth-first graph traversal on the netlist based on one of a minimum depth heuristic or a maximum length acyclic path heuristic, wherein the minimum depth heuristic traverses the directed graph of the unfolded netlist to identify, for each input of the netlist, a minimum depth before an input value at time 0 affects the constraint, and wherein the maximum length acyclic path heuristic determines, for each input, a maximum depth of a fan-in of the constraint before reaching an input.

29. The system of claim 21, wherein the instructions further cause the processor to:
evaluate initial states of registers in the netlist by performing a constraint satisfaction evaluation for each constraint over a plurality of time steps equivalent to the time step parameter to ensure that chosen values for inputs will not result in the constraint being in a dead-end constraint condition.

30. The system of claim 29, wherein the instructions cause the processor to simulate the netlist for a predetermined number of time steps by:
computing, for each time-step of the simulation, a legal set of one or more inputs to apply to the netlist by performing a constraint satisfaction evaluation for the constraint of the netlist, for a plurality of time steps equivalent to the time step parameter, to ensure that chosen values for the one or more inputs will not cause the constraint to reach a dead-end constraint condition; and
recording the legal set of one or more inputs in a trace file.

* * * * *